United States Patent
Watson et al.

(10) Patent No.: US 10,461,504 B2
(45) Date of Patent: Oct. 29, 2019

(54) VERTICALLY-COUPLED SURFACE-ETCHED GRATING DFB LASER

(71) Applicant: ElectroPhotonic-IC Inc., Kanata (CA)

(72) Inventors: Christopher Watson, Ottawa (CA); Kirill Pimenov, Ottawa (CA); Valery Tolstikhin, Ottawa (CA); Fang Wu, Ottawa (CA); Yury Logvin, Ottawa (CA)

(73) Assignee: ElectroPhotonic-IC Inc., Kanata (CA)

( * ) Notice: Subject to any disclaimer, the term of this patent is extended or adjusted under 35 U.S.C. 154(b) by 0 days.

(21) Appl. No.: 16/392,780

(22) Filed: Apr. 24, 2019

(65) Prior Publication Data
US 2019/0252861 A1   Aug. 15, 2019

Related U.S. Application Data

(63) Continuation of application No. 12/917,553, filed on Nov. 2, 2010, now abandoned.

(51) Int. Cl.
*H01S 5/223*   (2006.01)
*H01S 5/22*   (2006.01)
(Continued)

(52) U.S. Cl.
CPC .......... *H01S 5/2232* (2013.01); *H01S 5/1231* (2013.01); *H01S 5/22* (2013.01);
(Continued)

(58) Field of Classification Search
CPC .............. G02B 6/03638; G02B 27/146; H01S 3/10007; H01S 3/094053
See application file for complete search history.

(56) References Cited

U.S. PATENT DOCUMENTS

| 4,468,850 A | 9/1984 | Liau et al. |
| 4,506,367 A | 3/1985 | Akiba et al. |

(Continued)

OTHER PUBLICATIONS

F. Xia et al., "Photonic Integration using Asymmetric I win-Waveguide (ATG) Technology (Part 1) Concepts and Theory", IEEE J. Sel Topics in Quant. Electron., 11, 17, 2005. https://ieeexplore.ieee.org/abstract/document/1395887.
(Continued)

*Primary Examiner* — Tuan N Nguyen
(74) *Attorney, Agent, or Firm* — de Wilton Intellectual Property Inc.

(57) ABSTRACT

A VCSEG-DFB laser, fully compatible with MGVI design and manufacturing methodologies, for single growth monolithic integration in multi-functional PICs is presented. It comprises a laser PIN structure, in mesa form, etched from upper emitter layer top surface through the active, presumably MQW, gain region, down to the top surface of the lower emitter. Lower electrical contacts sit adjacent the mesa disposed on the lower emitter layer with upper strip contacts disposed atop the upper emitter layer on the mesa top. An SEG is defined/etched from mesa top surface, between the upper strip contacts, through upper emitter layer down to or into the SCH layers. Vertical confinement is provided by the SCH structure and the lateral profile in the bottom portion of the mesa provides lateral confinement. The guided mode interacts with the SEG by the vertical tail penetrating the SEG and evanescent field coupling to the SEG.

19 Claims, 7 Drawing Sheets

(51) Int. Cl.
*H01S 5/12* (2006.01)
*H01S 5/20* (2006.01)
*H01S 5/02* (2006.01)
*H01S 5/042* (2006.01)

(52) U.S. Cl.
CPC .......... *H01S 5/0208* (2013.01); *H01S 5/0422* (2013.01); *H01S 5/2018* (2013.01); *H01S 5/2081* (2013.01)

(56) References Cited

U.S. PATENT DOCUMENTS

| | | | |
|---|---|---|---|
| 4,701,995 | A | 10/1987 | Dolan et al. |
| 4,722,092 | A * | 1/1988 | Liau ............... H01S 5/1228 372/108 |
| 4,777,148 | A | 10/1988 | Liau et al. |
| 4,777,488 | A | 10/1988 | Carlman, Jr. et al. |
| 4,974,232 | A * | 11/1990 | Morinaga ............... H01S 5/026 372/46.01 |
| 5,659,562 | A | 8/1997 | Hisa |
| 6,741,630 | B2 | 5/2004 | Takiguchi |
| 7,283,694 | B2 | 10/2007 | Welch et al. |
| 7,444,055 | B2 | 10/2008 | Tolstikhin et al. |
| 7,457,496 | B2 | 11/2008 | Joyner |
| 7,466,882 | B2 | 12/2008 | Kish, Jr. et al. |
| 7,532,784 | B2 | 5/2009 | Tolshikhin et al. |
| 7,539,373 | B1 | 5/2009 | Logvin et al. |
| 7,567,606 | B2 | 7/2009 | Carras et al. |
| 7,609,919 | B2 | 10/2009 | Tolstikhin et al. |
| 7,636,522 | B2 | 12/2009 | Nagarajan et al. |
| 7,796,656 | B2 | 9/2010 | Watson et al. |
| 2001/0046246 | A1 | 11/2001 | Watanabe et al. |
| 2006/0120428 | A1 | 6/2006 | Oh et al. |
| 2006/0172446 | A1 | 8/2006 | Reithmaier et al. |
| 2008/0261157 | A1 | 10/2008 | Lee et al. |
| 2009/0116522 | A1 * | 5/2009 | Watson ............... H01S 5/12 372/38.01 |
| 2009/0117678 | A1 | 5/2009 | Reithmaier et al. |
| 2010/0202486 | A1 * | 8/2010 | Masui ............... H01S 5/18344 372/46.012 |

OTHER PUBLICATIONS

V. I. Menon et al., "Photonic Integration using Asymmetric Twin-Waveguide (ATG) Technology (Part 2) Devices", IEEE J. Sel Topics in Quant. Electron., 11, 30, 20 https://ieeexplore.ieee.org/abstract/document/1395888.

C. Watson et al., "Optically Pre-Amplified Photodetectors for Multi-Guide Vertical Integration in InP", Paper TuB1.6, International Conf. Indium Phosphide and Related Materials 2009. https://ieeexplore.ieee.org/abstract/document/5012466.

V. Tolstikhin et al., "Laterally Coupled DFB Lasers for One-Step Growth Photonic Integrated Circuits in InP", Phot. Tech. Lett. vol. 21, No. 10, pp. 621-623. https://ieeexplore.ieee.org/abstract/document/4787128.

S. B. Kuntze, "Transmitter and Receiver Solutions for Regrowth Free Multi-Guide Vertical Integration", Integrated Photonics Research 2010, Paper ITuC5. https://www.osapublishing.org/abstract.cfm?uri=IPRSN-2010-ITuC5.

K. Pimenov et al., "Analysis of High-Order Surface Etched Gratings for Longitudinal Mode Selection in DFB Lasers", Numerical Simulation of Optoelectronic Devices 2010, Paper TuC3. https://ieeexplore.ieee.org/abstract/document/5595671.

V. Tolstikhin et al., "Integrated Photonics: Enabling Optical Component Technologies for Next Generation Access Networks" Optical Fiber Communication and Optoelectronics Conference 2007. https://ieeexplore.ieee.org/abstract/document/4410749.

L. M. Miller et al., "A Distributed Feedback Ridge Waveguide Quantum Well Heterostructure Laser", IEEE Phot. Tech. Lett., vol. 6, No. 9, 1991. https://ieeexplore.ieee.org/abstract/document/68030.

V. Tolstikhin et al., "One Step Growth Optical Transceiver PIC in InP", ECOC 2009, Paper 8.6.2. https://ieeexplore.ieee.org/abstract/document/5287202.

Reid et al., "Narrow Linewidth and High Power Distributed Feedback Lasers Fabricated without a Regrowth Step", Proc. ECOC 2003, Rimini. link to document online not found.

M. Aoki et al., InP-Based Reversed-Mesa Ridge-Waveguide Structure for High-Performance Long-Wavelength Laser Diodes, IEEE 1. Selective Topics in Quantum Electron., vol. 3, No. 2, pp. 672 (1997). https://ieeexplore.ieee.org/abstract/document/605720.

Z. L. Liau et al., "A Novel GaInAsP/InP Distributed Feedback Laser" (Appl. Phys. Lett., vol. 46, No. 3, pp. 221, 1985. https://aip.scitation.org/doi/abs/10.1063/1.95689.

S. Nakagawa et al., "88C Continuous-Wave Operation of Apertured, Intracity Contacted 1.55mm Vertical-Cavity Surface-Emitting Lasers" Appl. Phys. Lett., vol. 78, p. 1337 (2001). https://aip.scitation.org/doi/abs/10.1063/1.1352668.

N. Iwai et al., "High Performance 1.3μm InAsP Strained-Layer Quantum-Well ACIS (Al-Oxide Confined Inner Stripe) Lasers", IEEE J. Selected Topics in Quantum Electron., vol. 5, No. 3, p. 694 (1999). https://ieeexplore.ieee.org/abstract/document/788437.

M. H. M. Reddy et al, "Lattice Matched AlGaAsSb Oxide for Current Confinement in InP-based Long Wavelength VCSELs", J. Cryst. Growth, vol. 251, No. 1-4, p. 776 (2003). https://www.sciencedirect.com/science/article/pii/S0022024802023898.

D. Pasquiello et al, "Selective Undercut Etching of InGaAs and InGaAsP Quantum Wells for Improved Performance of Long-Wavelength Optoelectronic Devices" J. Lightwave Technol., vol. 24, No. 3, p. 1470 (2006). https://www.osapublishing.org/jlt/abstract.cfm?uri=JLT-24-3-1470.

D. A. Buell et al entitled "InP-Based 1310-1550nm Lattice-Matched VCSELs", LEOS 2001, Proceed. p. 447 (2001). https://ieeexplore.ieee.org/abstract/document/954134.

V. Tolstikhin "Distributed Feedback Lasers for Regrowth-Free Multi-Guide Vertical Integration in InP", Invited paper at IEEE Photonic Society 23rd Annual Meeting Denver, CO, Nov. 2010. https://ieeexplore.ieee.org/abstract/document/5698990.

* cited by examiner

Prior Art

VERTICALLY-COUPLED SURFACE-ETCHED GRATING DFB LASER

CROSS-REFERENCE TO RELATED APPLICATION

This application is a continuation of U.S. patent application Ser. No. 12/917,553 filed Nov. 2, 2010 entitled VERTICALLY-COUPLED SURFACE-ETCHED GRATING DFB LASER, which is incorporated herein by reference in its entirety.

FIELD OF THE INVENTION

The invention relates generally to the field of semiconductor lasers, and more particularly to the design of the distributed-feedback lasers for use in photonic integrated circuits.

BACKGROUND OF THE INVENTION

III-V semiconductor laser diodes are the most efficient and compact sources of coherent radiation in near infrared spectral range. As such, they are an obvious choice for use in optical communication systems based on silica fibers which have windows of transparency falling into the emission range of these III-V semiconductor laser diodes. Whereas the basic principle of achieving an optical gain is the same for all laser diodes and relates to an inversion of free carrier population by electrical injection into a forward biased PIN junction, it is the optical cavity solution that mainly differentiates the semiconductor laser designs. One of the most common, and often most preferable, solutions is a distributed feedback (DFB) cavity. It offers a number of advantages to the laser designer, among which include the possibility of providing dynamically single-frequency generation, an ability to control the lasing frequency in the process of fabrication (by means of lithography) and suitability for monolithic integration with optical waveguides, modulators and other waveguide photonic devices. Therefore, semiconductor laser diodes featuring DFB cavities, hereafter referred to simply as DFB lasers, have become the laser sources of choice in advanced optical communication systems. Also, the DFB laser is an on-chip laser source solution for photonic integrated circuits (PICs), which combine different active and passive waveguide-based functional elements of the optical circuit by monolithically integrating them onto one semiconductor substrate.

In the context of the advanced optical networks, these dynamically single-frequency DFB lasers are routinely used all across the network, from local access to long-haul applications, where the system requires low frequency chirp (e.g. high-speed, long-haul propagation over dispersive fiber) or fixed carrier frequency (e.g. dense wavelength division multiplexing) or both. Therefore, DFB lasers are amongst the most demanded and massively produced optical components for telecommunications markets. The great majority of the DFB lasers addressing these markets are designed for operation in either the 1550 nm or 1310 nm wavelength windows, corresponding to the spectral ranges of minimal loss and minimal dispersion of silica fibers, respectively. The material system of choice, which naturally covers these wavelength windows, being indium phosphide (InP) based compound semiconductors from groups III and V, hereafter referred to as III-V semiconductors.

From the PIC prospective, DFB lasers are an attractive design option that not only has the advantage of dynamically single-frequency operation, but also is suitable for a monolithic integration with other waveguide components, both active (e.g. electro-absorption modulator) and passive (e.g. mode converter), onto the same semiconductor substrate, which a laser with a cavity defined by cleaved-facets such as Fabry-Perot (FP) lasers are not. For the majority of applications in today's optical communication systems, PICs featuring laser sources, similar to stand-alone lasers, need to operate in the 1550 nm or 1310 nm wavelength windows, making InP and related III-V semiconductors the natural choices for the substrate and material system of the PIC, respectively.

Despite of a wide-spread manufacturing of the stand-alone InP-based DFB lasers covering the important communication spectral windows above, commercial production of the InP-based PICs having these lasers for the on-chip light sources are still in their infancy and, as of today, practically limited to a few companies. The reason, partially, is in the difficulty of photonic integration itself, but, mainly, an inability to do it in a cost-efficient way, which not only makes it difficult for PICs to compete with micro-optically assembled or hybrid integrated counterparts, but also dramatically narrows market opportunities for those PICs. Therefore, design and fabrication solutions for DFB lasers that would be compatible with a cost-efficient monolithic photonic integration in InP-based material system remain an important problem to solve on the way for advancement of PIC technologies to high-scale commercialization and deployment.

The operating principle of the DFB laser cavity is based on multi-beam interference in an optical waveguide having periodic modulation of the effective index as seen by the guided waves, hereafter referred to as a waveguide Bragg grating. More specifically, a DFB cavity effect occurs when co-directional guided waves, which have experienced multiple reflections from the Bragg grating, are in-phase with each other and add through constructive interference. For any given grating order m, this happens under conditions of a direct resonant coupling between the contra-directional guided waves occurring near the Bragg wavelength given by Equation (1) below:

$$\lambda_B = \frac{2\Lambda n_{\mathit{eff}}}{m}, \qquad (1)$$

where $\Lambda$ is the period of the grating and $n_{\mathit{eff}}$ is the wavelength dependent effective refractive index of the guided mode. As a result, the DFB cavity is a wavelength selective cavity, with a selection defined by the grating pitch, an advantage that makes DFB lasers attractive for applications requiring emission wavelength control.

Whereas the basic operating principle of the DFB cavity is the same for any form and shape of the Bragg grating, its actual performance depends on many factors including the grating order, type of a spatial modulation of the effective index seen by the guided modes in the optical waveguide bearing the grating, e.g. whether this is a modulation of a real or an imaginary or both the real and imaginary parts of the effective index, and the coupling efficiency of the grating. From this prospective, the choices available to DFB laser designer are many, but in reality the most common solutions are compromises between performance and manufacturability.

Performance-wise, it is always advantageous to have the first order grating, i.e. m=1, and thereby avoiding coupling of the guided waves to, and radiation loss, through non-guided waves, hereafter also referred to as radiative waves. However, for any given emission wavelength λ, the corresponding grating pitch Λ is given by Equation (2) below:

$$\Lambda = \frac{m\lambda}{2n_{\text{eff}}} \quad (2)$$

and of all the grating orders the shortest grating pitch, and most challenging from the grating patterning point of view, being for m=1. For example, in the wavelength window at 1310 nm, the first order grating pitch should be only ~200 nm so that for a duty cycle of 50% it requires ~100 nm lithography line resolution. This is not possible to achieve with a conventional (contact) optical lithography or even a stepper optical lithography usually available to laser fabrication and requires different and more expensive techniques to be used, such as direct electron beam writing, focused ion beam writing, or most commonly optical beam interference.

In the last case, the waveguide Bragg grating is usually formed by fabricating an etched corrugation in a semiconductor layer that is close to the waveguide core as this leads to a strong coupling between the contra-directional guided waves in a spectral range near Bragg resonance and therein leads to favorable DFB cavity characteristics such as narrow resonance line and high rejection of wavelengths outside the resonance range. This technique is well documented in the prior art, see for example S. Akiba et al in U.S. Pat. No. 4,506,367 entitled "Distributed Feedback Semiconductor Laser". Z-L Liau et al in U.S. Pat. No. 4,722,092 entitled "GaInAsP/InP Distributed Feedback Laser" and G. L. Dolan et al in U.S. Pat. No. 4,701,995 entitled "Method of Making a Non-Planar Buried-Heterostructure Distributed-Feedback Laser" and is nearly universally used in today's commercial fabrication of the DFB lasers operating in the important wavelength ranges, including 1310 nm and 1550 nm communication windows. More recent attempts to improve and/or simplify the process include those reported by T. Takiguchi in U.S. Pat. No. 6,741,630 entitled "Ridge Waveguide Distributed Feedback Laser", Y. Hisa in U.S. Pat. No. 5,659,562 entitled "Semiconductor Laser including Embedded Diffraction Grating", and M. Carras et al in U.S. Pat. No. 7,567,606 entitled "Strong Distributed Feedback Semiconductor Laser."

The fundamental feature of such techniques is that they all require an additional epitaxial growth, performed after the corrugated grating etch, to complete the laser waveguide structure and provide the semiconductor material suitable for forming the electric contact at the top of the laser structure. An overgrowth is a process that not only complicates fabrication and reduces yield by generating defects at the interface of the etched corrugated grating in the proximity to (in a case of the index-coupled grating) or within (in a case of the gain-coupling grating) the laser gain region, but also restricts compatibility of so-processed DFB lasers with other functional elements and thereby limits their usability for monolithic PICs. To overcome this limitation, usually more (selective area) growth steps are required, which follow the (selective area) etching that eliminates unneeded additionally grown semiconductor material in the areas designated to other functional elements of the PIC, which makes the PIC complicated to fabricate while fabrication suffers from yield loss. As a result, deployments of PICs fabricated by using such multiple growth step techniques have been limited to those where high costs and low yields can be absorbed and volumes relatively low, e.g. large-scale integration PICs for long-haul WDM optical communication systems reported including D. Welch et al in U.S. Pat. No. 7,283,694 entitled "Transmitter Photonic Integrated Circuits (TxPIC) and Optical Transport Networks Employing TxPICs", C. Joyner in U.S. Pat. No. 7,457,496 entitled "Receiver Photonic Integrated Circuit (RxPIC) Chip Utilizing Compact Wavelength Selective Decombiners", F. Kish et al in U.S. Pat. No. 7,466,882 entitled "Monolithic Transmitter/Receiver Photonic Integrated Circuit (Tx/Rx PIC)" and R. L. Nagarajan et al in U.S. Pat. No. 7,636,522 entitled "Coolerless Photonic Integrated Circuits (PICs) for WDM Transmission Networks and PICs Operable with a Floating Signal Channel Grid Changing with Temperature but Fixed Channel Spacing in the Floating Grid."

For a monolithic PIC technology to win over the multiple hybrid integration technologies commercially deployed in volume, at least in the areas where both can deliver the required functionality and performance even though in different ways, it has to be more cost effective. Therefore, there is a need in the art of photonic integration for developing integration techniques and platforms, which would reduce high fabrication complexity and low-yield processes such as multiple step epitaxial growth, while preserving the required range of the PIC functionality. DFB laser design and fabrication based on defining and etching the corrugated grating in the proximity to or within the laser gain region, with the following up overgrowth, do not seem to meet these requirements and hence other design and fabrication solutions need to be sought in order to make the DFB laser a compatible building block to cost-efficient PICs.

One particular approach to cost-efficient PICs is based on a multi-guide vertical integration (MGVI) platform. This is a generic and versatile technology, which, unlike most of its counterparts, is implementable in one-step epitaxial growth process. e.g. on an InP substrate, see V. Tolstikhin et al in U.S. Pat. No. 7,444,055 entitled "Integrated Optics Arrangement for Wavelength (De)multiplexing in a Multi-grade Vertical Stack". In essence, MGVI is a generalization of a twin-guide vertical integration technique, see F. Xia et al in "Photonic Integration using Asymmetric Twin-Waveguide (ATG) Technology (Part 1)—Concepts and Theory" (*IEEE J. Sel. Topics in Quant. Electron.*, 11, 17, 2005) and V. M. Menon et al in "Photonic Integration using Asymmetric Twin-Waveguide (ATG) Technology (Part 2)—Devices" (*IEEE J. Sel. Topics in Quant. Electron.*, 11, 30, 2005) and the references contained therein, towards multi-functional PICs in which optical waveguides with different functions are vertically stacked in order of ascending guiding layer bandgap wavelength, and adiabatic transitions between them are affected by lateral tapers defined at each guiding level. Functional elements at different vertical levels are optimized independently, while the required PIC functionality is achieved by a proper choice of the guide layers and their relative position in the vertical stack.

Recently, this technique has been successfully demonstrated to be capable of a monolithic integration of all key functions anticipated from PICs for fiber-optics communication systems, including on-chip generation, amplification and detection of light as well as wavelength division multiplexing, mode/spot size converting, beam splitting and re-routing. The design principles, fabrication and characterization of some exemplary MGVI PIC implementation methodologies may be established from references such as V. Tolstikhin et al in U.S. Pat. No. 7,532,784 entitled "Integrated Vertical Wavelength (De)Multiplexer" and Y. Logvin et al in U.S. Pat. No. 7,539,373 entitled "Integrated Lateral Mode Converter" and for actual PICs themselves from references including V. Tolstikhin et al in "Laterally Coupled DFB Lasers for One-Step Growth Photonic Integrated Circuits in InP" (Phot. Tech. Lett. Vol. 21, No. 10, pp 621-623), C. Watson et al in "Optically Pre-Amplified Photodetectors for Multi-Guide Vertical Integration in InP" Paper TuB1.6, International Conf. Indium Phosphide and Related Materials 2009), V. Tolstikhin et al in "One Step Growth Optical Transceiver PIC in InP" (ECOC 2009, Paper 8.6.2), S. B. Kuntze et al in "Transmitter and Receiver Solutions for Regrowth Free Multi-Guide Vertical Integration" (Integrated Photonics Research 2010, Paper ITuC5), and K. Pimenov et al in "Analysis of High-Order Surface Etched Gratings for Longitudinal Mode Selection in DFB Lasers" (Numerical Simulation of Optoelectronic Devices 2010, Paper TuC3).

As it concerns an on-chip laser source, the requirement for compatibility with the MGVI platform restricts the design choices by excluding such common laser solutions including cleaved-facet Fabry-Perot cavities (requires physical separation of the laser from the rest of the PIC), distributed reflector/feedback cavities with waveguide Bragg gratings defined at the interface between laser guide layers (these require epitaxial re-growth), butt-coupling to the passive waveguide (these require an additional growth step), and bottom contact at the back surface of the highly conductive substrate (incompatible with monolithic integration). Besides, to preserve the cost efficiency of the MGVI platform, its key differentiating feature in enabling the massive applications in the optical access and interconnect networks as presented by V. Tolstikhin in "Integrated Photonics: Enabling Optical Component Technologies for Next Generation Access Networks" Optical Fiber Communication and Optoelectronics Conference 2007), costly and/or non-volume scalable processes are also undesirable, such as direct-write e-beam lithography.

Figures 1A, 1B:
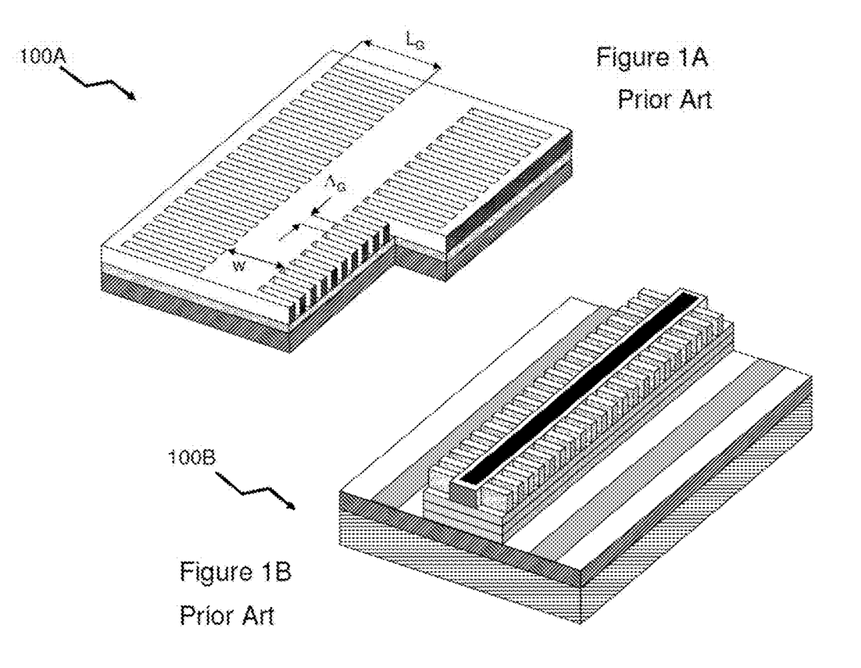
FIG. 1A depicts a schematic three-dimensional view of an effective ridge LCSEG-DFB laser according to the prior art, using two parallel sets of periodic trenches separated by a strip of an intact semiconductor material to form both the effective ridge waveguide and the laterally-coupled waveguide Bragg grating within an etched mesa structure.
FIG. 1B depicts a schematic three-dimensional view of an effective ridge LCSEG-DFB laser according to the prior art, using two parallel sets of periodic trenches separated by a strip of an intact semiconductor material to form both the effective ridge waveguide and the laterally-coupled waveguide Bragg grating within an etched mesa structure, featuring one top strip contact in the middle of the mesa and two bottom strip contacts aside from the mesa.
Figure 1C:
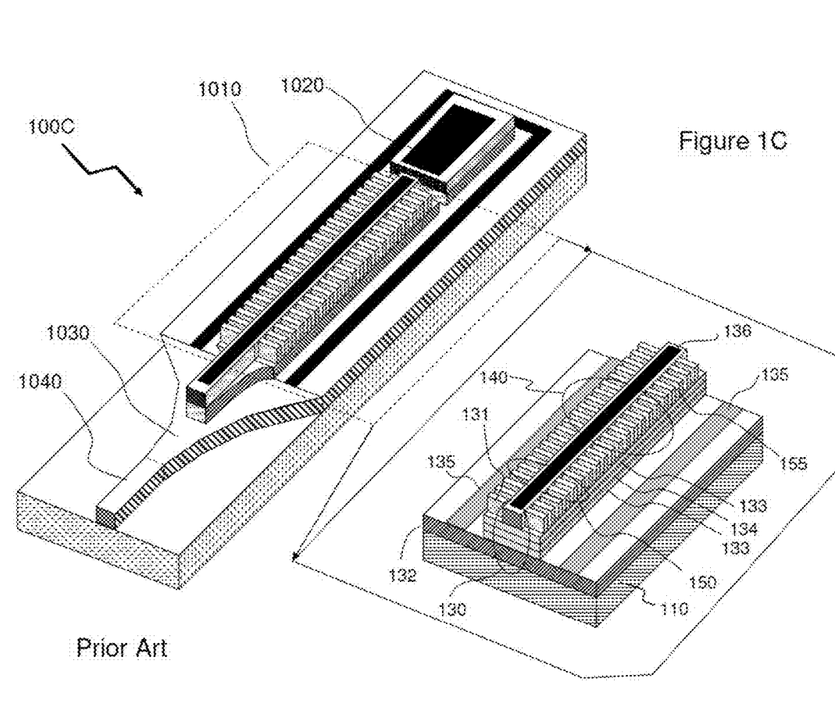
FIG. 1C depicts a schematic three-dimensional view of a LCSEG-DFB source structure employing a MGVI compatible design LCSEG-DFB laser as per FIG. 1B, together with a detector and vertical mode coupler.

A solution that addresses all these issues is an effective-ridge waveguide, laterally-coupled grating distributed feedback (LCG-DFB) laser, first reported by Miller et al, as a stand-alone P-contact up device on N+-substrate in GaAs material system in "A Distributed Feedback Ridge Waveguide Quantum Well Heterostructure Laser" (IEEE Phot. Tech. Lett. Vol. 6, No. 9, 1991) as illustrated by first schematic 110 in FIG. 1. This was subsequently re-engineered to be MGVI compatible in an N-contact up device on semi-insulating substrate in InP material system by V. Tolstikhin et al in "Laterally-Coupled DFB Laser for One-Step Growth Photonic Integrated Circuits in InP" (IEEE Phot. Tech. Lett., Vol. 21, pp 621-623, 2009). This design being illustrated in FIG. 2 by second schematic 120 and described below combines the advantages of the DFB laser with its suitability for a regrowth-free monolithic integration with other functional elements, as shown by third schematic 130 in FIG. 1 and described below. The key element of the LCG-DFB laser is the surface etched grating (SEG) formed in the laser's top N-emitter layer by etching two parallel sets of periodic trenches separated by a strip of intact material between them. This SEG provides both lateral confinement, as the average refractive index in each set of periodic trenches is lower than that in the intact material, and the DFB cavity which are processed in one fabrication step. This obviously is an advantage of such a design, which hereafter is referred to as an effective ridge design, the effective ridge being formed by the two parallel sets of trenches and the stripe of intact material between them. MGVI compatible LCG-DFB lasers featuring this design, as a generic building block of multi-functional PIC or a part of a bidirectional transceiver duplex PIC, have been reported by S. B. Kuntze et al in "Transmitter and Receiver Solutions for Regrowth Free Multi-Guide Vertical Integration" (Integrated Photonics Research 2010, Paper ITuC5) and V. Tolstikhin et al in "One Step Growth Optical Transceiver PIC in InP" (ECOC 2009, Paper 8.6.2), respectively. Also, these devices are integral parts of the PIC based transceiver products for access optical networks; see for example OneChip Photonics Inc. (www.onechipphotonics.com/products).

However, the effective ridge DFB cavity has inherent performance limitations associated with the way the SEG is defined and interacts with the guided waves in the laser cavity. More specifically, the coupling efficiency of such a DFB cavity is relatively low, as compared to its counterparts featuring corrugated grating defined within or in a close proximity to the optical waveguide. Since for a given length of the grating, the coupling efficiency defines the laser cavity quality and all performance features associated with it, less efficient coupling requires longer cavities and higher bias currents, which certainly is not a preferable choice in most laser designs and especially those intended for a high-speed direct modulation A coefficient of direct resonance coupling between contra-propagating guided waves in a waveguide with $m^{th}$ order Bragg grating is given by Equation (3) below:

$$\kappa_m = \left(\frac{\pi}{\lambda n_{eff}}\right)\langle \varphi^* | A_m | \varphi \rangle \qquad (3)$$

which is defined as the overlap of the normalized guided mode function, $\varphi$, with the $m^{th}$ spatial harmonic of the grating $A_m$. In the simple case of a rectangular shaped grating $A_m$ is expressed as given below in Equation (4):

$$A_m = \frac{\Delta \varepsilon'}{m\pi} \sin(m\pi\gamma) \qquad (4)$$

where $\Delta \varepsilon'$ is the difference in optical permittivity for a wavelength close to the resonance wavelength $\lambda_B = 2\Delta n_{eff}/m$ between the etched (grating trench) and unetched (grating tooth) parts of the grating, and, is the grating duty cycle, defined as a fraction of the grating period occupied by the grating tooth. Accordingly the direct resonance coupling coefficient is reduced to that given below in Equation (5), see G. P. Agrawal and N. K. Dutta, "Long-Wavelength Semiconductor Lasers", Published by Van Nostrand, 1968:

$$\kappa_m = \frac{\sin(m\pi\gamma)}{m} \frac{\Delta \varepsilon'}{\lambda n_{eff}} \langle \varphi^* | A_m | \varphi \rangle \qquad (5)$$

Considering first the term $\langle \varphi^* | A_m \varphi \rangle$ on the right hand side of this equation, which in essence represents the optical mode overlap with the grating; it is relatively small for any grating order since only a tiny fraction of the optical mode, confined vertically in the laser guide underneath the SEG and laterally—by the effective ridge, penetrates the SEG. Such coupling, when wave interaction occurs only due to the evanescent field at the tails of the guided mode, is often referred to as the evanescent field coupling. Second, in a practical implementation, the grating order is limited by the lithography line resolution. So, for a first order grating, which yields the highest coupling coefficient and does not produce radiation losses, in the 1310 nm telecommunications wavelength window, the first order grating requires the line resolution be below 100 nm. Whilst, in principle, this resolution is achievable, e.g. by direct-write e-beam or X-line stepper lithography, practically it is out of reach in most cases. For the examples above, the former is too slow a process for commercial production while the latter is a very expensive tool, usually not found in III-V optoelectronic fabrication facilities. More typical for such facilities, which, opposite to their silicon counterparts do not enjoy such high volumes that would justify expensive deep ultraviolet stepper lithography, yet not quite a commodity, is a I-line stepper with an emission wavelength of 362 nm. Accordingly, for the example of the 1310 nm wavelength range the first order grating is beyond diffraction limit of such a stepper, and the only available solutions for the stepper lithography are higher order gratings, presumably m≥3. But increasing the grating order further reduces the resonance coupling coefficient, by a factor of 1/m, thereby making an evanescent-field coupled LCG-DFB even a more challenging task.

Therefore, there is an inherent problem in achieving high coupling efficiency in LCG-DFB lasers, which, otherwise, are very attractive from their design and fabrication points of view and also well suited for a regrowth-free monolithic integration with other functional elements into MGVI based PICs for low-cost transceiver applications, such as optical access networks and interconnects. Within the prior art, the research has sought a solution to enhancement of the coupling efficiency through various advanced—and more complicated than a straightforward surface grating definition and etch—techniques. For example such techniques have included forming the grating, either by optical stepper lithography (see for example Reid et al in "Narrow Linewidth and High Power Distributed Feedback Lasers Fabricated without a Regrowth Step", Proc. ECOC 2003 Rimini) or electron beam lithography (e.g. D. K. Oh et al in US Patent Application 2006/0120428 entitled "Distributed Feedback (DFB) Semiconductor Laser and Fabrication Method Thereof") in the entire outer profile of the semiconductor waveguide structure;) or forming grating elements in sloped lateral sidewalls of the waveguide structure (see for example Y. T. Lee et al in US Patent Application 2008/0261157 entitled "Semiconductor Laser Device and Method of Manufacturing the Same"). Also, approaches that include forming buried lateral grating elements, and hence require a re-growth step, have been proposed (see for example Y. Watanabe et al in US Patent Application 2001/0046246 entitled "Ridge Type Semiconductor Laser of Laterally Coupled Distributed Feedback and Method Manufacturing the Same" and J. R. Reithmaier et al in US Patent Applications 2006/0172446 and 2009/0117678 each entitled "Semiconductor Laser with a Weakly Coupled Grating."). All these or similar techniques, while enhancing the coupling efficiency, also complicate fabrication or/and require additional growth step(s). However, it would be highly advantageous to find a solution to providing DFBs within PICs that would enhance the coupling efficiency while preserving a simple and straightforward SEG fabrication process, compatible with the MGVI platform. Since the fabrication process change is not an option, such a solution should be sought in a design change, obviously.

An approach that enhances the coupling efficiency of the laterally coupled SEG (LC-SEG) within the context of a MGVI manufacturing methodology has been proposed by V. Tolstikhin et al in U.S. Pat. No. 7,609,919 entitled "Coupling-Enhanced Surface Etched Gratings" and employs additional effective ridge waveguide elements on either side of the active effective ridge waveguide, such that the side effective ridges provide an intended dilution of the lateral confinement of the optical mode resulting in an increased overlap of the this mode with the SEG regions forming the active and side effective ridges. In effect, the coupling efficiency of the grating can be increased, but only if the effective ridges are narrow enough, as well as the LC-SEG areas that separate them—narrower than the wavelength in the semiconductor material, which is difficult to implement because of the lithography resolution limitations. Another approach to enhancing the coupling efficiency of the LC-SEG, which also exploits the idea of the lateral mode dilution, even though in a different way, has been described by C. Watson et al in U.S. Pat. No. 7,796,656 entitled "Enhanced Efficiency Laterally-Coupled Distributed Feedback Laser." Within this prior art, the LC-SEG DFB laser operates in the first order lateral mode, as opposed to the conventional fundamental zero order mode, thereby having the optical mode field mostly aside from the active effective ridge, where it is better overlapped with the LC-SEG and hence provides higher coupling with the LC-SEG. This design has yet another advantage, in that it reduces the mode overlap with the metal contact atop the active effective ridge and impact of the SEG etch rounding/irregularities at the trench edges next to the active effective ridge, thereby reducing intracavity loss and further improving the coupling efficiency. On a flip side, this laser needs to be complemented with a certain waveguide arrangement that transfers the first order lateral mode, in which the laser operates, into the zero order optical mode, in which optical signals can be coupled into a fiber or other parts of the PIC. Whereas such an arrangement is feasible within the MGVI platform, e.g. in a form of the lateral mode converter described by Y. Logvin et al in U.S. Pat. No. 7,539,373 BI entitled "Integrated Lateral Mode Converter", still it complicates fabrication and also introduces additional insertion loss.

Therefore, the problem of designing a SEG-DFB laser that is not only compatible with MGVI platform, but also is economic in terms of its fabrication within this platform, while providing high coupling efficiency with the SEG, remains largely unsolved in the prior art. It would be beneficial if such a design allowed for the coupling efficiency enhancement without compromising the optical mode confinement within the gain region, something that the prior art teaching does not allow since it taught the optical mode dilution as means for the coupling enhancement with the SEG. High optical mode confinement within the gain region being important for reduction of threshold current for lasing operation and temperature sensitivity of the laser. It would be further beneficial if the SEG-DFB laser design relaxed the fabrication tolerances, e.g. by avoiding the optical mode overlap with the parts of the SEG that are most difficult to control in a process of fabrication, notably the SEG trench edges at the effective ridge side. Corner rounding and irregularities that occur in these trenches just aside from the effective ridge may badly impact the coupling efficiency and scattering loss when overlap with the optical mode, as it is happening in LC-SEG designs taught by the prior art. It is an intention for the invention to overcome the above-mentioned limitations in the prior art.

OBJECT OF THE INVENTION

The object of the invention is a vertically-coupled surface etched grating distributed feedback (VCSEG-DFB) laser, which, within the SEG-DFB design paradigm and MGVI design/fabrication platform, enables for a grating coupling efficiency enhancement at higher optical mode confinement with the gain region and lower sensitivity to the grating processing imperfectness as compared to its laterally-coupled surface etched grating distributed feedback (LC-SEG-DF) counterpart. In accordance with the invention, a VCSEG-DFB laser features a mesa structure with the SEG, in a form of a periodic set of trenches defined in the middle part of the mesa, etched down from the top surface of the mesa and perpendicular to the direction of propagation along the mesa, while mesa's top surface aside from the SEG is used to define top laser contact, in a form of two metal strips going along the mesa and disposed on both sides of the SEG. Epitaxial structure of the mesa comprises the top and bottom emitters with a separate-confinement heterostructure (SCH) layers, including the gain region, presumably in a form of active multiple quantum well (MQW) layers, between them, such that, in use, the SEG is formed in the top emitter layer above the SCH layers. Vertical optical confinement is defined by the SCH, which is designed to provide a sufficiently high evanescent field coupling with the SEG in the middle part of the mesa. Lateral optical confinement in such a structure, opposite to the LCSEG-DFB design teachings of the prior art, is not provided by the SEG itself but can be arranged by profiling refractive index in the mesa layers below the SEG in a way suitable for a lateral guiding. In effect, the fundamental optical guided mode shape in the VCSEG-DFB laser is vertically inverted as compared to that in the LCSEG-DFB laser: the former is laterally confined at the bottom of the mesa and overlaps with the VC-SEG by the bulk of the mode field, whereas the latter is laterally confined at the top of the mesa and overlaps with the LC-SEG only by the evanescent field at the lateral tails of the mode. Increased overlap between the fundamental optical mode and the SEG in VCSEG-DFB laser is achieved without further compromising the mode confinement within the gain region, thereby enabling more design flexibility in a trade-off between higher coupling with the Bragg grating vs. higher modal gain. At the same time, the fundamental optical mode in the VCSEG-DFB laser is less subjected to metal loss than that in the LCSEG-DFB laser, since the metal strips atop the mesa can be disposed away from this mode, as well as rounding and etch irregularities at the grating trench edges can be made less critical by widening the grating trenches beyond the lateral mode size. As a result, the grating coupling efficiency in such a VCSEG-DFB laser being increased, while the optical loss and manufacturing variations reduced against the prior art based on the LCSEG-DFB laser design.

SUMMARY OF THE INVENTION

In accordance with the invention, there is provided a design of the VCSEG-DFB laser and regrowth-free method of manufacturing the same that comprises a laser PIN structure processed in a form of a mesa etched from the top surface of the upper, P- or N-, emitter layer, through the SCH, including the active, presumably MQW, gain region, down to the top surface of the lower, N- or P-, emitter, with the lower strip contacts disposed at the top surface of the lower emitter layer aside from the mesa and the upper strip contacts disposed at the top surface of the upper emitter layer, which also is the top surface of the mesa, and a SEG defined at and etched from this top surface, in the space between two upper strip contacts, through the upper emitter layer down to or into the SCH layers. An optical waveguide is formed by the SCH that naturally provides a vertical confinement to the optical field and a certain special arrangement for the lateral profile of the refractive index in the bottom portion of the mesa to provide a lateral confinement to the optical field, such that, in use, the waveguide supports only one—fundamental—guided optical mode, which is laterally defined at the bottom of the mesa and interacts with the SEG at the top of the mesa, by the vertical tail of the mode penetrating the SEG and evanescent field coupling to the SEG.

An electrical injection under a forward bias of the PIN structure is achieved by applying a proper polarity voltage between the upper and lower strip contacts, with a lateral distribution of a majority carrier injection up from the lower emitter predetermined in a certain way by a relationship between the lower emitter and SCH layer sheet resistances, such that, in use, a lateral confinement—or a current aperture—can be provided in the bottom portion of the mesa in order to optimize the injection current overlap with the optical mode, thereby increasing the injection efficiency and enhancing the laser performance. Further in accordance with the invention, the design and regrowth-free manufacturing of the VCSEG-DFB laser of said species is provided that combines the lateral confinement of the optical field and that of the injection current at the bottom of the mesa in one lateral feature fabricated in the same processing step(s), which not only simplifies the device fabrication, but also ensures close to optimal overlap between the optical mode and the injection current. Finally, in accordance with the invention, such a VCSEG-DFB laser is fully compatible with the MGVI design principles and manufacturing methodologies, thereby being suitable for a one-step growth monolithic integration with other passive and active functional elements into a multi-functional PIC, based on the MGVI platform.

BRIEF DESCRIPTION OF DRAWINGS

Embodiments of the present invention will now be described, by way of example only, with reference to the attached FIGS., wherein.

DETAILED DESCRIPTION OF EMBODIMENTS OF THE INVENTION

The invention is directed to providing, within a concept of a surface-etched grating distributed feedback (SEG-DFB) laser, an increased overlap between the guided optical mode propagating within a laser's waveguide and vertically-coupled to SEG, to arrange for an efficient DFB cavity and thereby enhance a laser performance while mitigating limitations of the prior art, using a laterally-coupled SEG, such as low coupling efficiency, high intracavity loss and strong impact of SEG fabrication imperfectness on both the coupling efficiency and intracavity loss.

Reference may be made below to specific elements, numbered in accordance with the attached figures. The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

Shown in FIG. 1A is a schematic three-dimensional view 100A of a prior art embodiment of an effective-ridge LCSEG-DFB laser, as it has been originally proposed and demonstrated by L. M. Miller, et al in "A Distributed Feedback Ridge Quantum Well Heterostructure Laser". IEEE Photonics Technol. Lett., Vol. 3, pp. 6 (1991). The device, implemented in AlGaAs—GaAs material system, is grown on N$^+$-substrate and features P-up/N-down contacts, the former being disposed at the back side of the (thinned and polished) substrate and the latter—atop the effective ridge, which is formed by the SEG shaped as two parallel but separated sets of periodic trenches. As is, it is not suitable for a monolithic integration with other functional elements onto the same substrate, least it is compatible with a regrowth-free MGVI platform.

Illustrated by FIG. 1B is an adaptation of the LCSEG-DFB laser to this regrowth-free MGVI platform, shown as second schematic 100B, in a form of an integrated transmitter building block featuring N-up/P-down strip contacts, the former being disposed atop the effective ridge in the centre of the laser mesa and the latter aside from and at the bottom of the laser mesa, and also a back-side power monitor at laser's rear end and a passive waveguide at laser's front end, proposed and implemented by V. Tolstikhin et al in "Laterally-Coupled DFB Laser for One-Step Growth Photonic Integrated Circuits in InP". IEEE Photonics Techn. Lett., Vol. 21, P. 621 (2009). The device, designed for and implemented in InP-based material system, is grown on semi-insulating (SI) substrate and can be monolithically integrated onto the same substrate, in one-step growth process, with other functional elements, to which it can be optically connected by a passive waveguide underneath the active—laser—waveguide.

Referring to FIG. 1C there is shown a schematic three-dimensional view 100C of the LCSEG-DFB source employing a MGVI compatible LCSEG-DFB design 1010, according to second schematic 100B in FIG. 1B, together with N-up rear facet power monitor 1020 and vertical mode transition 1030 to couple the laser output to the passive waveguide 1040 of the PIC. Also shown inset within FIG. 1C is the MGVI compatible LCSEG-DFB design which vertically represents a P-down/N-up laser PIN atop of passive (i.e. transparent for radiation emitted by the laser) waveguide(s) grown on SI substrate 110, such that it can be combined with and optically connected to other functional elements of the PIC grown onto the same substrate and processed without any additional growth step or post-growth modification of semiconductor materials. The laser PIN structure 130 comprises N—InP 131 and P—InP 132 emitter layers at the top and the bottom, respectively, and also SCH layers 133 in between. The SCH layers 133 are formed from AlGaInAs materials, with (compressively) strained MQW gain region 134 positioned in the middle of the SCH. Laterally, the laser mesa 140 is processed by etching from the top surface of N—InP emitter layer 131, through this layer, the SCH layers 133, and the strained MQW gain region 134, down to the top surface of the P—InP emitter layer 132. The laser effective ridge waveguide is formed by the SEG 150, which is etched from the top surface of the N—InP emitter layer 131, through this layer, down to the SCH layers 133. The laser strip P- and N-contacts, 135 and 136 respectively, are disposed on the top surfaces of P-emitter layer 132 and N-emitter layer 131, aside from and atop of the mesa 140, respectively. The SEG 150 being formed by a pair of periodic sequences of trenches 155 etched on either side at the edges of the N—InP emitter layer 131 leaving a central unetched region with periodic lateral ribs left remaining in the N—InP emitter layer 131.

In the context of the present invention, all the major features—both strong and weak—of this prior art can be understood by examining fabrication and performance of the device represented by the schematic three-dimensional view 100C of FIG. 1C. In terms of the fabrication, the most critical processing steps are definition and etching of the SEG 150. If a high-resolution lithography, e.g. a direct-write electron beam lithography, is not an option, then, as discussed above, the first order SEG is also not an option for a communication lasers operating in 1.3 μm-1.6 μm spectral range and, most probably, the grating order m≥3. Since the coupling efficiency in such a SEG is higher for a high duty cycle $\gamma$, defined as the grating teeth size $\alpha$ relative to the grating period $\Lambda$: $\gamma=a/\Lambda$ (see e.g. V. Tolstikhin et al in "Laterally-Coupled DFB Laser for One-Step Growth Photonic Integrated Circuits in InP", *IEEE Photonics Techn. Lett.*, Vol. 21, P. 621 (2009)), there is an advantage in designing the SEG with a very high, $\gamma \approx 90\%$, duty cycle. However, such a grating should have a very narrow trench 155 to be etched from the mesa surface, which would limit the trench depth since the trench etch aspect ratio, defined as the trench depth to width ratio, usually cannot exceed few units. As a result, a high duty cycle SEG is limited in its etch depth, and the shallower it is, the closer to the laser guide core the top mesa surface needs to be in order to preserve the coupling efficiency at a level sufficient for a good DFB laser performance. However, since the top metal, laser-strip N-contact 136, is disposed on the same mesa surface, atop of the effective ridge formed by the two parallel sets of periodic trenches, also serving as the laterally-coupled waveguide Bragg grating, the shallower SEG means higher overlap between fundamental guided optical mode and the top contact metal, laser-strip N-contact 136, thereby resulting in a higher intracavity loss caused by this metal. Hence, a LCSEG-DFB structure design faces a difficult trade-off between the demand for a high coupling efficiency, which suggests a high duty cycle, shallow SEG and thus thin top emitter layer, and a desire to reduce the intracavity optical loss, which, on the contrary, requires a thick top emitter layer. Whereas a certain optimization within the LCSEG-DFB laser design concept that addresses the trade-off issue above indeed is possible, e.g. as reported by V. Tolstikhin in "Distributed Feedback Lasers for Regrowth-Free Multi-Guide Vertical Integration in InP" (Invited Paper at IEEE Photonic Society $23^{rd}$ Annual Meeting, Denver, Colo., November 2010), this is a tough problem to solve and thus a design change that would relax the trade-off between the coupling efficiency of a SEG and the top metal optical loss in the laser waveguide, still within the SEG-DFB concept, is highly desirable.

Figure 2A:
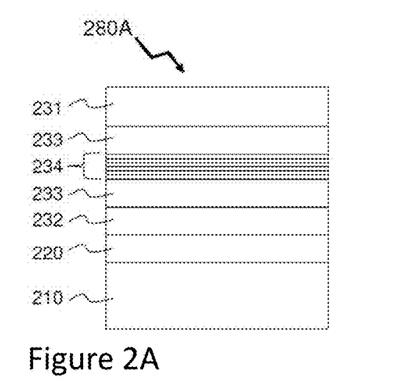
FIG. 2A depicts a schematic cross-section of layers of exemplary VCSEG-DFB lasers according to embodiments of the invention and FIGS. 2B, 2C and 2D depict schematic cross-sections providing lateral optical field and electrical current confinement.

The present invention provides such a design change that is illustrated in FIGS. 2A to 2E. FIG. 2A shows an exemplary cross-sectional view of layer structure 280A of a VCSEG-DFB laser 200 of an embodiment illustrated in FIG. 2E. The layer structure 280A is the same as that of the prior art shown in FIGS. 1B and 1C. Accordingly, exemplary layer structure 280A is a semiconductor layer vertical stack, grown in one growth step on a SI InP:Fe substrate 210, that has a laser PIN structure positioned atop of a passive optical waveguide 220, wherein the PIN structure comprises N—InP 231 and P—InP 232 emitter layers at the top and bottom, respectively, with SCH layers 233, including compressively strained MQW gain region layers 234, in between. However, the device lateral structure design is different from that of the LCSEG-DFB laser design of the prior art, at least in the following two aspects.

First, instead of having two parallel sets of the periodic trenches at the edges of the laser mesa, defined at and etched from the mesa's top surface, which trenches form both the effective ridge waveguide and the laterally-coupled waveguide Bragg grating, while the upper contact metal is disposed atop of the effective ridge and between two parallel sets of periodic trenches, as in the LCSEG-DFB laser design of the prior art illustrated in FIGS. 1B and 1C, the VCSEG-DFB design of the embodiments illustrated in FIGS. 2B to 2E has one set of the periodic trenches 265 in the centre of the laser mesa, also defined at and etched from the mesa's top surface, which trenches form the vertically-coupled waveguide Bragg grating, but do not provide lateral guiding, while the upper contact metal 257B still is disposed atop of the mesa but aside from the set of the periodic trenches 265 in the mesa centre. Lower contact metal 275A is disposed on the lower emitter layer aside of the mesa.

Second, since there is no effective-ridge waveguide formed by the SEG in the VCSEG-DFB laser design of the present invention, there must be provided means for the lateral confinement of the optical field other than those of the LCSEG-DFB laser design of the prior art. Furthermore, because of the lateral optical confinement cannot be provided at the top of the laser mesa—SEG, as a set of periodic trenches etched in the centre of the mesa, has (averaged over period) refractive index lower than that in the intact material on both sides of the grating—it has to be arranged at the bottom of or within the mesa. For this matter, there are solutions known from a prior art, which were proposed for the purposes other than the lateral confinement of the optical field, most commonly for the injection current confinement in the ridge waveguide laser structures, but also can be used as means for the lateral guiding in the context of the present invention. Furthermore, these same solutions actually provide lateral confinement of both the optical field and injection current, which, in use, can be taken an advantage of by designing the laser mesa such that the electrical injection and the optical mode overlap in a self-consistent way. Some exemplary mesa designs of this nature are described below.

Figure 2B:
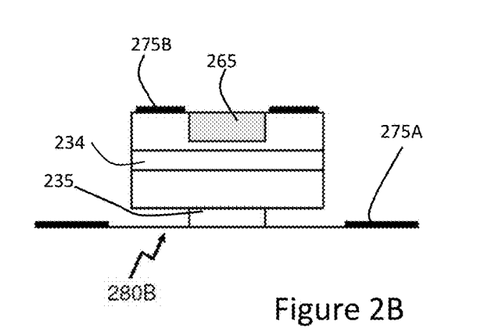

In the first embodiment of the invention illustrated by the first laser mesa's cross-section 280B shown schematically in FIG. 2B, the lateral confinement for both the optical field and injection current is achieved by a lateral undercut of the semiconductor material 235 at the bottom of the mesa. In practice, such a lateral undercut in InP-based material system is implementable by inserting a $Ga_xIn_{1-x}As_yP_{1-y}$ or $Al_xGa_yIn_{1-x-y}As$ layer in between two InP layers and using highly selective chemical (wet) etcher that etches $Ga_xIn_{1-x}As_yP_{1-y}$ or $Al_xGa_yIn_{1-x-y}As$ at a rate much higher than it etches InP. This process, even though as that used in different configurations and for different purposes, is well documented in a prior art, e.g. by Z.-Z. Liau, et al in the U.S. Pat. No. 4,468,850, where the GaInAsP active layer sandwiched between P- and N-emitter InP layers and positioned in the vertical stack at the bottom of the P-up/N-down edge-emitting laser mesa grown on $N^+$—InP substrate was undercut to form a buried heterostructure (BHS) by means of a mass-transport technique, or by S. Nakagawa, et al in the paper entitled "88C Continuous-Wave Operation of Apertured, Intracavity Contacted, 1.55 mm Vertical-cavity Surface-Emitting Lasers", *Appl. Phys. Lett.*, Vol. 78, P. 1337 (2001), where AlGaInAs active region at the bottom of the N-up/P-down vertical-cavity surface-emitting laser (VCSEL) mesa grown on $P^+$—InP substrate was chemically undercut to provide a lateral injection confinement in a form of the hole current aperture. Process-wise alternative but functionally similar solution is a lateral oxidation of Al-rich material, ternary $Al_xIn_{1-x}As$ or quaternary $Al_xGa_yIn_{1-x-y}As$, sandwiched between two InP layers, instead of the lateral undercut, e.g. as disclosed by N. Iwai et al in the paper entitled "High-Performance 1.3-m InAsP Strained-Layer Quantum-Well ACIS (Al-Oxide Confined Inner Stripe) Lasers", *IEEE J. Selected Topics in Quantum Electron.*, Vol. 5, No 3, P. 694 (1999) or by M. H. M. Reddy et al in the paper entitled "Lattice-Matched $Al_{0.95}Ga_{0.05}AsSb$ Oxide for Current Confinement in InP-Based Long Wavelength VCSELs", *J. Cryst. Growth*, Vol. 251. No 1-4, P. 776 (2003). It should be clear to those skilled in the art that this prior art, while providing a generic methodology of the fabrication arrangement compatible with the MGVI platform and suitable for a lateral confinement of the optical field in the context of the present invention, does not teach the particular design solution illustrated by the laser mesa cross-section sketch of first mesa cross-section 280B, where the entire SCH region, including active MQWs, is not subjected to a lateral alteration after the mesa etch, but a specially inserted undercut/oxidation layer 235 below the SCH layers and just above the lower P—InP emitter is. It also should be understood by those skilled in the art that in either case, i.e. whether the lateral undercut or the lateral oxidation of a specially inserted layer at the bottom of the laser mesa, the resulted lateral diaphragm structure allows for a lateral confinement of both the optical field and the injection (hole) current, such that, in use, choice of material composition, thickness and width of the diaphragm layer allows for a design optimization towards highest possible overlap between the optical mode and the material gain in the active MQW region, without compromising other essential parts of the mesa design, e.g. the SCH layers and the active MQWs therein.

Figure 2C:
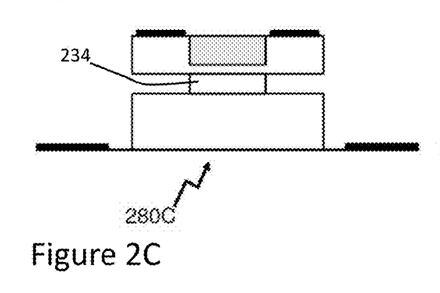

In the second embodiment of the invention illustrated by the second laser mesa's cross-section 280C shown schematically in FIG. 2C, the lateral confinement for both the optical field and injection current is achieved by a lateral undercut of the semiconductor material of some of SCH layers, e.g. active MQW layers 234, in the middle of the mesa. Since these layers, by default, have to have narrower bandgap and hence higher refractive index that N- and P—InP emitter layers on both sides of the SCH, they must be made from the materials other than InP, most commonly $Ga_xIn_{1-x}As_yP_{1-y}$ and $Al_xGa_yIn_{1-x-y}As$ materials, which, again, can be used for a lateral undercut by means of selective chemical (wet) etching. Examples of such a process can be found in a in prior art, e.g. in the paper by D. Pasquariello et al entitled "Selective Undercut Etching of InGaAs and InGaAsP Quantum Wells for Improved Performance of Long-Wavelength Optoelectronic Devices", *J. Lightwave Technol.*, Vol. 24, No 3, P. 1470 (2006) and paper by D. A. Buell et al entitled "InP-Based 1310-1550 nm Lattice-Matched VCSELs", *IEOS* 2001, Proceed. P. 447 (2001), respectively. Again, it should be clear to those skilled in the art that these papers provide generic techniques that are compatible with MGVI technology and suitable for a fabrication arrangement resulting in a lateral diaphragm in the middle of the mesa, by undercutting some of the SCH layers sandwiched between the N- and P—InP emitter layers, as it is sketched in second laser mesa's cross-section 280C, but not the design examples in the context of the present invention. Also, whereas the lateral oxidation of Al-rich layers in SCH composed from $Al_xGa_yIn_{1-x-y}As$ materials is possible, as alternative to the lateral undercut, it may be not a preferable solution since the oxidation of the active MQW layers usually results in a rise of the surface recombination rate and leakage current, which, in a combination with lateral narrowing of these layers, may severely affect the injection efficiency.

Figure 2D:
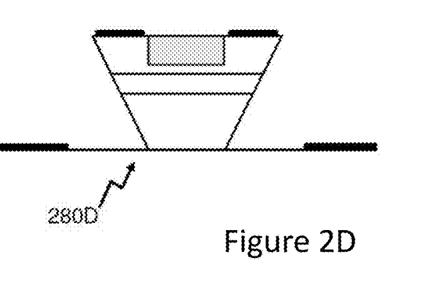

In the third embodiment of the invention illustrated by the third laser mesa's cross-section 280D shown schematically in FIG. 2D, the lateral confinement for both the optical field and injection current is achieved by means of a selective anisotropic wet etching, first, the upper N—InP emitter layer down to the SCH layers and, second, the SCH layers, down to the lower P—InP emitter layer. In such a process, e.g. as reported by M. Aoki et al in the paper entitled "InP-Based Reversed-Mesa Ridge-Waveguide Structure for High-Performance Long-Wavelength Laser Diodes" (IEEE J. Selective Topics in Quantum Electron., Vol. 3, No. 2, pp. 672 (1997)).

The above-described embodiments of the present invention are intended to be examples only, as it concerns to the arrangements for providing the lateral confinement to the optical field below the SEG region—a must in the VCSEG-DFB construction that, opposite to its LCSEG-DFB counterpart, lacks the lateral optical confinement in the SEG area and also to the injection current flowing from the lower emitter layer up into the active MQW layers within the SCH region—an advantageous but not absolutely required feature that, in use, allows for an optimization of the optical mode overlap with the material gain in the MQW region. Other embodiments serving the same purpose or/and alterations, modifications and variations of these particular embodiments are conceivable to those of skill in the art without departing from the scope of the invention, which is defined solely by the claims appended hereto.

Figure 2E:
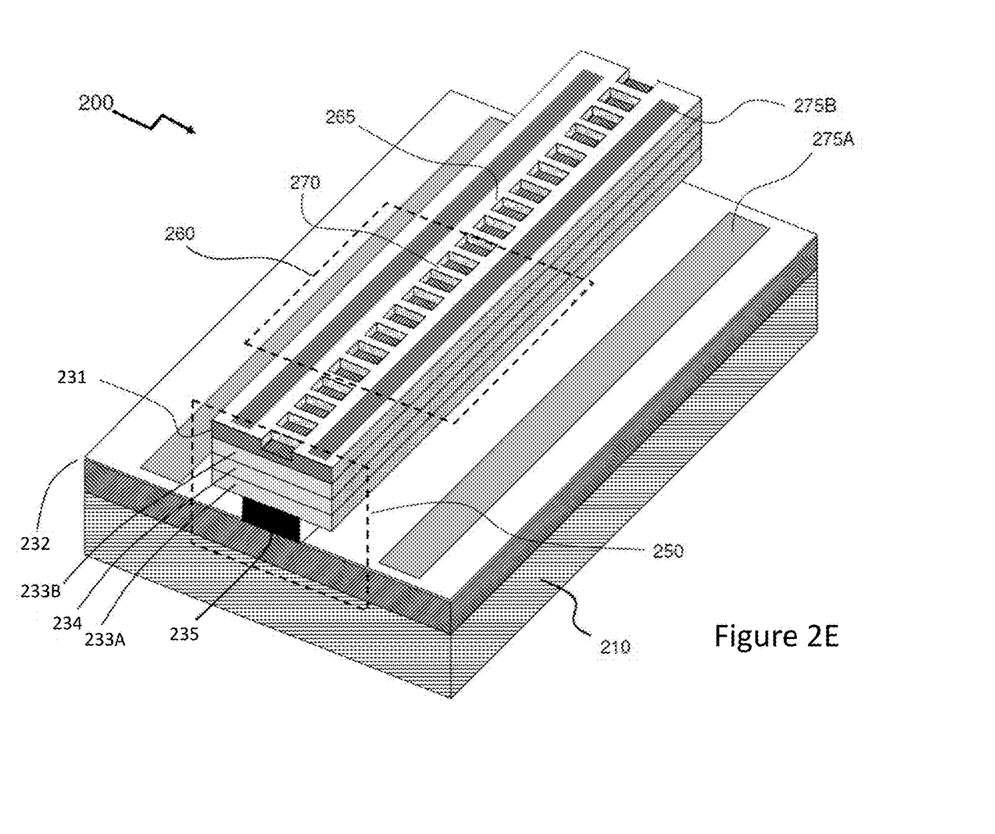
FIG. 2E depicts a schematic three-dimensional view of an exemplary VCSEG-DFB laser according to an embodiment of the invention.
Figure 3A:
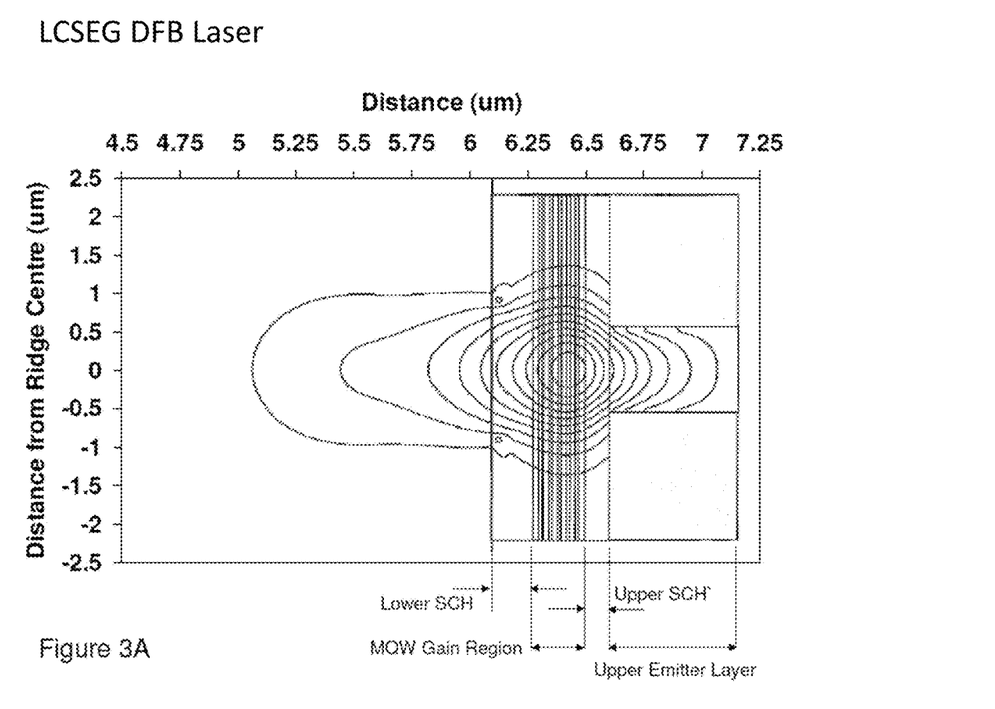
FIG. 3A depicts an exemplary layer structure of a prior art LCSEG-DFB laser and a two-dimensional profile of the fundamental guided mode therein.
Figure 3B:
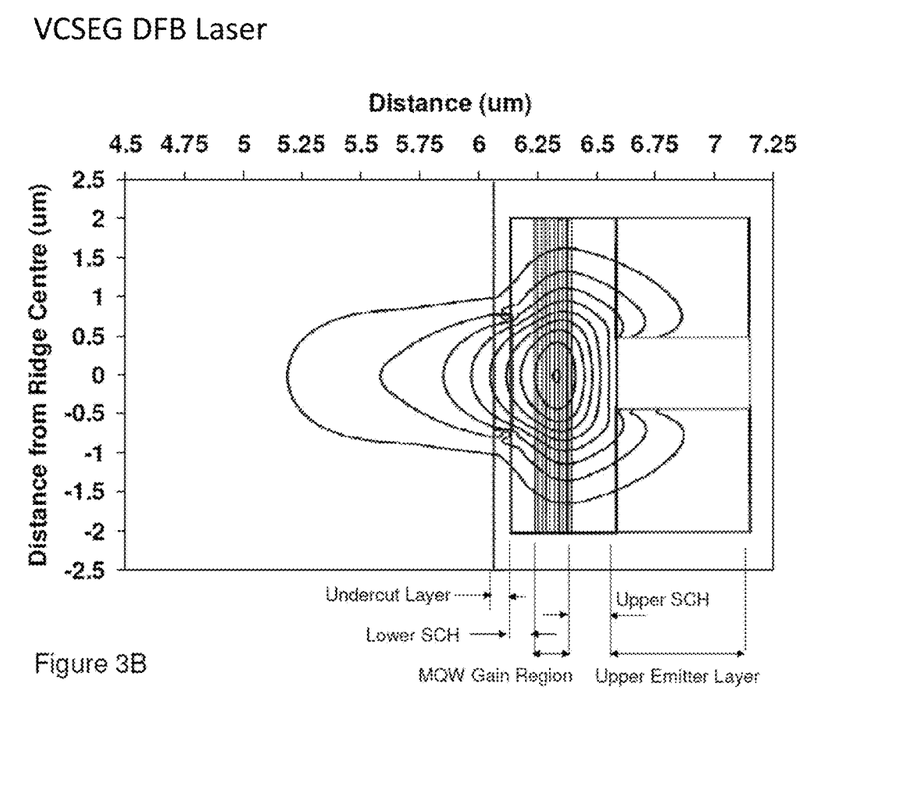
FIG. 3B depicts an exemplary layer structure of a VCSEG-DFB laser of an embodiment and a two-dimensional profile of the fundamental guided mode therein, evanescent-field coupled to the SEG in the center top part of the mesa.

Referring to FIG. 2E and FIGS. 3A and 3B there will now be shown the schematic layout of the VCSEG-DFB laser 200 and illustrated its difference from the LCSEG-DFB counterpart of the prior art, respectively, by referring to the first embodiment of the invention, in which the lateral optical and injection current confinement is provided by undercutting the specially inserted AlGaInAs layer 235 at the very bottom of the mesa, which layer is sandwiched between two InP layers and selectively chemically (wet) etched while InP layers are not affected and other AlGaInAs layers, e.g. in the SCH region, are protected by a dielectric mask.

Referring to FIG. 2E there is shown is a schematic three-dimensional view of the VCSEG-DFB laser structure 200. It is grown on SI Fe:InP substrate 210 and comprises, bottom to top: a lower P—InP emitter layer 232, an undercut AlGaInAs layer 235, upper and lower SCH layers 233A and 233B respectively with MQW gain region 234 in the middle, and an upper N—InP emitter layer 231 at the top, with SEG 260 etched from the top surface of this layer down to towards the upper SCH layer 233B, and in some instances to the upper SCH layer 233B. Like in a case of its LCSEG-DFB counterpart illustrated by FIG. 1C, this structure may sit atop of the passive (i.e. transparent for radiation emitted by the laser) waveguide layers, which, in use, are inserted between the substrate and the lower P—InP emitter, which are not shown in FIG. 2E for clarity. The laser mesa 250 is processed by etching from the top surface of the upper N—InP emitter layer 231, through this layer and the upper and lower SCH layers 233A and 233B, down to the top surface of the lower P—InP emitter layer 232. In embodiments of the invention SEG 260 may be for example a $3^{rd}$ order SEG, in a form of periodic trenches 265 separated by intact material 270 of the upper N—InP emitter layer 231, is defined in the central part of the mesa, with the grating etch depth, width and duty cycle being the design parameters available for the performance optimization, e.g. achieving the desirable high coupling efficiency between the lasing mode and the grating, without compromising the mode's loss due to scattering on grating edges or mode's gain under direct bias of the laser PIN. The laser strip P- and N-contacts, 275A and 275B are disposed on the top surfaces of the upper N—InP emitter layer 231 and lower N—InP emitter layer 232, aside from and atop of the mesa 250, respectively, such that the SEG is positioned between two strip N-contacts 275B.

It should be noted that a DFB laser with a configuration that may be confused with that of VCSEG-DFB laser 200 in FIG. 2B has been reported in the prior art, by Z. L. Liau et al in the paper entitled "A Novel GaInAsP/InP Distributed Feedback Laser" (Appl. Phys. Lett., Vol. 46, No 3, pp. 221, 1985) as well as U.S. Pat. No. 4,777,488 entitled "Process for Making a Mesa GaInAsP/InP Distributed Feedback Laser" and U.S. Pat. No. 4,722,092 entitled "GaInAsP/InP Distributed Feedback Laser". In this prior art, the DFB laser also has a mesa structure and the Bragg grating also is formed by etching the periodic trenches in the centre of the mesa, while the top metal contacts are disposed atop of the mesa, on both sides of the grating. However, there are fundamental differences between a DFB laser construction taught by Liau and the present invention. Before addressing these differences, it is instructive to detail the basic design by Liau, also noting that this design was not further developed and/or commercialized but rather disappeared over 20 years ago.

The manufacturing process flow disclosed by Liau includes what initially appears to be an undercut of a thin GaInAsP active layer within the mesa sandwiched between two InP layers to form the lateral guide and hence disclose an apparently comparable design to that of the recited invention. Liau teaches to an approximate lateral etch of approximately 5.5 μm to define the strip of the active layer from each side of the mesa. However, Liau subsequently buries the active strip waveguide using mass transport techniques, for example the structure is taught as thermally annealed at a temperature between 640° C. and 670° C. in the presence of phosphine. This causes migration of InP material from the vertically adjacent InP layers such that the undercut is removed by in-filling thereby resulting in a buried active strip . . . . This combination of deep lateral etch in the thin active layer, thickness 160 nm, and mass transport burying technique results in a buried active core for the waveguide rather than an undercut within the mesa. Liau's technique results in a highly variable active waveguide geometry such that the properties of the laser in terms of wavelength, confinement, threshold current, etc were not stable thereby leading to low yields in commercial applications.

Liau then formed the SEG atop the mesa using holographic photolithography to form a first-order grating with a periodicity of approximately 2000 Å and depth 2500 Å, although an alternate embodiment required etching 1 μm deep for devices operating in the telecommunication windows of 1.3 μm and 1.55 μm. The poor reproducibility of such deep, high aspect ratio trenches to form the SEG further impacted the performance of DFB devices fabricated by limiting factors such as reproducibility of linewidth, side-mode suppression etc. By contrast embodiments of the invention adapted a VCSEG design to a MGVI platform that removes requirements for doped InP substrates, wafer thinning and back-side metallization contacts to one with an SI substrate, the emitter disposed above a passive waveguide(s) and utilizing lateral contacts beside the mesa. Additionally embodiments of the invention exploit higher order SEG structures allowing the utilization of conventional optical stepper lithography for compatibility with standard semiconductor manufacturing, and restrict the grating etch depth to the upper emitter layer and do not extend it into the laser SCH and active layers in order to avoid damage/surface defects as well as recombination at the dry etch floor in the gain region. Accordingly embodiments of the invention exploit pure index coupling in the SEG whereas Liau tries to etch down into the active layer to achieve gain coupling that is advantageous from the point of view of side mode suppression. In summary, Liau teaches to Additionally through use of higher order gratings, not taught by Liau, embodiments of the invention establish either "gain-type" or "loss-type" complex coupling without the SEG penetrating the gain region by manipulating the sign of the imaginary part of the coupling coefficient by design, see K. Pimenov et al in "Analysis of High-Order Surface Etched Gratings for Longitudinal Mode Selection in DFB Lasers" (Proc. 10$^{th}$ Int. Conf. Numerical Simulation of Optoelectronic Devices, TuC3, September 2010). Accordingly the side mode suppression for high performance telecommunication DFB devices is achieved through a different coupling to that exploited by Liau.

Unlike Liau embodiments of the invention specifically exploit undercut of the mesa or lateral shaping of the mesa to provide lateral optical confinement that otherwise does not exist within the MGVI. Hence, embodiments of the invention exploit the high-contrast index step at the undercut which is buried in the prior art of Liau by the mass transport process thereby reducing the index step and diluting (laterally) the waveguide. Accordingly the undercut in Liau is for defining the active strip within the buried waveguide structure rather than providing the lateral optical confinement.

Additionally embodiments of the invention exploit the undercut in confining the injection current such that by appropriate design the mode-gain overlap can be optimized, which provides another degree of freedom in the design of the laser. Additionally the MGVI SEG-DFB approach of embodiments of the invention allows the use of either N-up/P-down and P-up/N-down designs, the former being more suitable for an efficient injection into SEG-DFB devices, either lateral or vertical, as well as a good ohmic contact on N—InP is easier to implement than one on P—InP as the P—InGaAs cap usually added to improve the P-contact cannot be employed for a relatively thin upper emitter layer as it will absorb all the light. Finally a MGVI SEG-DFB allows regrowth-free fabrication unlike the multiple epitaxial growths of Liau, see U.S. Pat. No. 4,777,148.

Accordingly a key feature that differentiates such a MGVI VCSEG-DFB laser from a conventional LCSEG-DFB laser is the structure of the lasing optical mode. Referring to FIG. 3A is there is presented a contour plot of the optical mode of a LCSEG-DFB overlaid to the physical structure of the active region. As shown there is a semiconductor stack comprising lower SCH layer of thickness approximately 160 nm, MQW active layer of thickness approximately 220 nm, upper SCH layer of thickness 110 nm, and upper emitter layer of thickness approximately 550 nm. The mesa having a width of 4.4 μm with the grating of width approximately 1.1 μm etched through the upper emitter layer. As such the optical mode is shown by contour plots with the centre of the optical mode towards the upper edge of the MQW active layer is fairly symmetric vertically.

Referring to FIG. 3B there is presented a contour plot of the optical mode of a MGVI VCSEG-DFB overlaid to the physical structure of the active region. As shown there is a semiconductor stack comprising undercut layer of thickness approximately 75 nm, lower SCH layer of thickness approximately 100 nm. MQW active layer of thickness approximately 150 nm, upper SCH layer of thickness 200 nm, and upper emitter layer of thickness approximately 550 nm. The mesa having a width of 4.0 μm with the grating of width approximately 0.95 μm etched through the upper emitter layer. As evident in the optical contour plot the optical mode now has increased confinement within the MQW layer, resulting increased gain overlap for the optical mode thereby reducing the threshold current for the laser. Additionally the optical mode is now substantially confined within the structure defined by the upper and lower SCH layers and MQW active layer.

Figure 4:
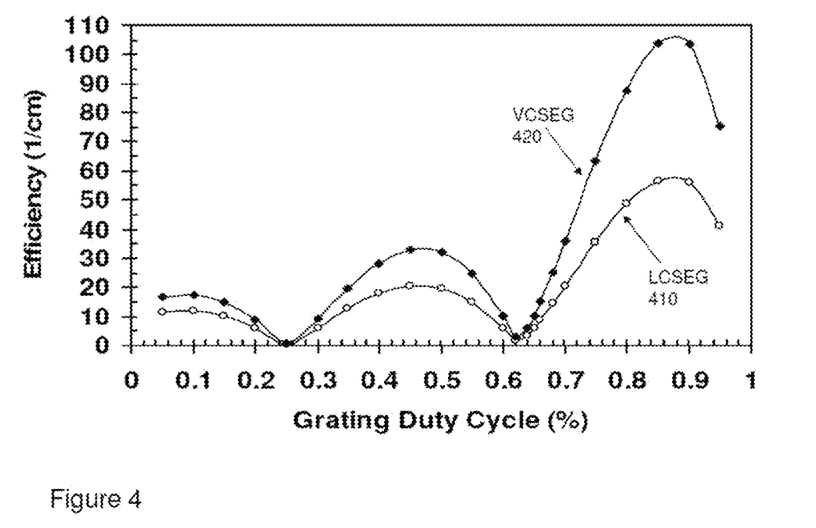
FIG. 4 depicts the calculated grating efficiency for LCSEG-DFB and VCSEG-DFB devices exploiting the exemplary layer structures presented in FIGS. 3A and 3B as a function of grating duty cycle.

Now referring to FIG. 4 there is depicted a graph for the calculated grating efficiency for LCSEG-DFB and VCSEG-DFB devices exploiting the exemplary layer structures presented in FIGS. 3A and 3B plotted as a function of grating duty cycle. Shown within the chart is first plot LCSEG 410 representing the prior art LCSEG structure, represented by FIG. 3A, for implementing optical emitters within PIC platforms. As is evident the structure yields a periodic efficiency with grating duty cycle with peaks at approximately 10%, 47% and 88% duty cycle with efficiencies (1/cm) of approximately 12, 21, and 57. respectively. An approximate 50% duty cycle being typical in prior art LCSEG devices due to the reduced fabrication complexity.

Second plot VCSEG 420 plots an embodiment of the invention, represented by FIG. 3B, showing efficiencies (1/cm) at the peaks of approximately 17.5, 33, and 104 respectively. As such at an approximate 50% duty cycle of the grating the VCSEG yields a 60% improvement in coupling efficiency and at approximately 90% duty cycle an improvement of over 80% is achieved. As would be evident to one of skill in the art such an improvement in coupling efficiency can be beneficially exploited to shorten laser cavities, wavelength selective filters, and other devices exploiting gratings as well as enhance the performance of the resulting laser emitters.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A device comprising:
   a mesa formed by a semiconductor structure comprising an epitaxial layer stack comprising a plurality of semiconductor layers grown on a semiconductor substrate;
   the plurality of semiconductor layers comprising a lower emitter layer, a lower separate confinement heterostructure, a multi-quantum well active gain region, an upper separate confinement heterostructure, and an upper emitter layer;
   a surface-etched grating comprising a set of periodic trenches defined along a top surface of the mesa to form a vertically coupled waveguide Bragg grating supporting a fundamental optical mode,
      a first electrical contact to the upper emitter layer provided on the top surface of the mesa each side of the surface-etched grating;
      a second electrical contact to the lower emitter layer provided each side of the mesa;
      wherein the upper and lower separate confinement heterostructures provide vertical optical confinement of the fundamental optical mode; and
      at least one layer of the plurality of semiconductor layers underlying the multi-quantum well active gain region is laterally undercut to define sidewalls of the mesa having a lateral profile that provides lateral optical confinement of the fundamental optical mode and lateral confinement of current injection.

2. The device of claim 1, wherein
   the surface-etched grating comprises a higher order grating, wherein parameters of the surface-etched grating define the sign of the imaginary part of the coupling coefficient between the surface grating and fundamental optical mode to establish either "gain-type" or "loss-type" coupling.

3. The device of claim 1, wherein the surface-etched grating is etched to a predetermined depth into the upper emitter layer.

4. A method of fabricating the device of claim 1, compatible with a single growth process for monolithic integration, comprising:
   providing a semiconductor substrate;
   providing an epitaxial layer stack comprising a plurality of semiconductor layers grown on the semiconductor substrate, wherein the plurality of semiconductor layers comprise a lower emitter layer, a lower separate confinement heterostructure, a multi-quantum well active gain region, an upper separate confinement heterostructure, and an upper emitter layer; and
   defining a mesa by etching the epitaxial layer, the mesa having sidewalls extending from a top surface of the mesa to a surface of the lower emitter layer;
   providing a surface-etched grating comprising a set of periodic trenches defined along the top surface of the mesa to form a vertically-coupled waveguide Bragg grating supporting a fundamental optical mode,
   wherein the upper and lower separate confinement structures provide vertical optical confinement of the fundamental optical mode;
   defining a first electrical contact to the upper emitter layer on the top surface of the mesa each side of the surface-etched grating;
   defining a second electrical contact to the surface of the lower emitter layer each side of the mesa; and
   wherein defining the mesa comprises undercutting at least one layer of said plurality of semiconductor layers underlying the multi-quantum well active gain region to define sidewalls of the mesa having a lateral profile that provides lateral optical confinement of the fundamental optical mode and lateral confinement of current injection.

5. The method of claim 4, wherein
   providing the surface-etched grating comprises establishing the sign of the imaginary part of the coupling coefficient between the surface grating and fundamental optical mode to a predetermined value to establish either "gain-type" or "loss-type" coupling.

6. The method of claim 4, wherein providing the surface-etched grating comprises etching the upper emitter layer to a predetermined depth.

7. The method of claim 4, wherein providing the surface-etched grating comprises etching a single series of periodic structures in the upper emitter layer of the epitaxial semiconductor structure to a predetermined depth into the upper emitter layer and the upper separate confinement heterostructure.

8. The method of claim 4, wherein the plurality of semiconductor layers further comprises a diaphragm layer disposed between the lower emitter layer and overlying layers, and wherein the step of undercutting comprises undercutting the diaphragm layer to provide said at least one layer that is laterally narrower than overlying layers thereby defining said lateral profile providing lateral optical confinement of the fundamental optical mode and lateral confinement of current injection.

9. The method of claim 4, wherein the step of undercutting comprises undercutting at least one layer of the lower separate confinement heterostructure to be laterally narrower than overlying layers thereby defining said lateral profile providing lateral optical confinement of the fundamental optical mode and lateral confinement of current injection.

10. The method of claim 4, wherein the step of undercutting comprises undercutting layers of the mesa to provide sidewalls of the mesa which are inwardly tapered from the top surface of the mesa to a narrower bottom of the mesa, thereby defining said lateral profile for lateral optical confinement and lateral confinement of current injection.

11. The method of claim 4, wherein the semiconductor substrate comprises a semi-insulating substrate, and further comprising providing a passive waveguide layer between the substrate and the lower emitter layer.

12. The method of claim 4, wherein said plurality of semiconductor layers of the epitaxial layer stack comprise III-V semiconductor materials selected from the group consisting of indium phosphide (InP) and gallium arsenide (GaAs) based III-V semiconductor materials systems.

13. The device of claim 1 further comprising:
   a vertical coupler for vertically coupling an emitted optical mode to a passive waveguide formed within the semiconductor structure, the passive waveguide vertically disposed between the substrate and the lower emitter layer.

14. The device of claim 1, wherein said at least one layer of the semiconductor layers that is laterally undercut comprises a diaphragm layer disposed between the lower emitter layer and overlying layers of the plurality of semicondutor layers, wherein the diaphragm layer provides said lateral profile providing lateral optical confinement of the fundamental optical mode and lateral confinement of current injection.

15. The device of claim 1, wherein said at least one layer of the plurality of semiconductor layers comprises at least one layer of the lower separate confinement heterostructure which is laterally narrower than overlying layers to provide said lateral profile providing lateral optical confinement of the fundamental optical mode and lateral confinement of current injection.

16. The device of claim 1, wherein sidewalls of the mesa are undercut and taper inwardly from the top surface of the mesa to a narrower bottom of the mesa to define said lateral profile providing lateral optical confinement of the fundamental optical mode and lateral confinement of current injection.

17. The device of claim 1, further comprising a passive waveguide layer disposed between the substrate and the lower emitter layer.

18. The device of claim 1, wherein the semiconductor substrate comprises a semi-insulating substrate.

19. The device of claim 1, wherein said plurality of semiconductor layers of the epitaxial layer stack comprise III-V semiconductor materials selected from the group consisting indium phosphide (InP) and gallium arsenide (GaAs) based III-V semiconductor materials systems.

* * * * *